INVENTORS.
ALBERT J. MEYERHOFF
CHARLES B. HEBELER
CHIEN C. HUANG
George L. Kensinger
AGENT INVENTORS.
ALBERT J. MEYERHOFF
CHARLES B. HEBELER
CHIEN C. HUANG
George L. Kensinger
AGENT United States Patent Office 3,384,809
Patented May 21, 1968

3,384,809

CONTROLLED INDUCTANCE DEVICE UTILIZING AN APERTURED SUPERCONDUCTIVE PLANE

Albert J. Meyerhoff, Wynnewood, and Charles B. Hebeler, King of Prussia, Pa., and Chien C. Huang, Stamford, Conn., assignors to Burroughs Corporation, Detroit, Mich., a corporation of Michigan Filed July 17, 1964, Ser. No. 383,431
16 Claims. (Cl. 323—44)

ABSTRACT OF THE DISCLOSURE

Apparatus is disclosed for controlling the self-inductance of a conductor between two extreme values or for controlling the mutual inductance between two electrically independent circuits. A plane of superconducting material is employed as a magnetic shield and a control magnetic field is provided for destroying the plane's superconductivity and thus its shielding qualities. The superconducting plane is provided with an aperture bridged with a superconductor of lower critical field than the rest of the plane. This bridge material is switched to its resistive state by a controlled magnetic field provided by an energized conductor placed near or around the bridge. In one application, the superconducting plane may be placed adjacent to a conductor for controlling the self-inductance of that conductor. In another application, the superconducting plane may be placed between two conductors for controlling the mutual inductance therebetween.

This invention relates to superconductor devices and more particularly to superconductor devices and apparatus in which the inductance of a conductor is controlled by affecting the shielding qualities of an adjacent superconducting ground plane or shield.

The phenomenon of superconduction in various materials when cooled to temperatures approximating a liquid helium environment has been long known. These superconductive materials have been utilized to fabricate a variety of circuits and systems, sometimes called cryogenic apparatus, for performing functions which previously had been performed exclusively by customary electronic and magnetic elements. Information storage elements and logic devices, the operation of which depends upon the control or switching of current flow in superconducting conductors, have been developed. The use of such devices has been found especially advantageous where small physical size, rapid response, and low power consumption is desirable. One such superconductor device is described in United States patent application, Ser. No. 258,268, now Patent No. 3,275,930 entitled "Superconducting Controlled Inductance Circuits," filed on Feb. 13, 1963, and of common ownership herewith. The utility of the devices of that and the present application resides in their capacity to control or switch current flow in circuit conductors of a superconductive device by controlling the inductance of said circuit conductors.

The controlled inductance superconductor device of the present invention utilizes the shielding effect provided a circuit conductor by a superconducting ground plane or shield. Also important to the subject invention is the susceptibility of superconductive materials to being rendered normally conductive when subjected to a sufficient level of energy from an electric or magnetic field or an electric current. The field or current magnitude necessary for driving a superconducting material resistive or normally conducting is termed the critical field or current for that material. For the purpose of aiding the discussion to follow, a hard superconductor is defined as a superconductor which, at a given operating temperature, requires a higher field or current to cause it to become resistive or normally conducting than another particular superconductor which may be termed a soft superconductor. The terms "soft" and "hard" are thus relative terms for distinguishing between different superconductors.

Thus, the shielding effect provided to a conductor by an adjacent continuous superconducting plane has been known, and also, it has been recognized that any closed path or ring of superconducting material will act as a barrier to magnetic fields that are normal to the plane of the closed path or ring and will therefore prevent penetration of said plane by any such magnetic field. (See D. Shoenberg, "Superconductivity" paragraph 2.6, published in London in 1952 by the Cambridge University Press.) And if an applied magnetic field is increased sufficiently, or if there is established a magnetic field in aiding relationship to that field of sufficient strength so that the sum of the fields exceeds the critical magnetic field of the superconducting material, the latter will go resistive thus permitting penetration of the plane by the magnetic field or fields.

The shielding effect provided to a current-carrying circuit conductor or film by an adjacent superconductive plane has been referred to in the art as the Meissner Effect. This effect is thought to be due to the induction of currents in the superconducting plane, the total magnitude of which equals the current flowing in the adjacent circuit conductor. The currents thereby induced generate a magnetic field equal to that produced by the circuit conductor and in opposition thereto so that magnetic flux is prevented from penetrating the plane. It has been found that this shielding effect occurs whether or not apertures appear in the superconducting plane so long as a continuous superconducting current path exists around each aperture. The presence of a superconducting shield adjacent a circuit conductor thus operates to limit or restrict the magnitude of the magnetic field that may be established by current flow in the circuit conductor regardless of whether or not apertures are present in the plane. By controllably reducing or destroying the shielding qualities of such a plane, it is therefore possible to control the magnetic flux produced by an adjacent current-carrying conductor and the self-inductance and inductive coupling of such a conductor as well.

The flux linkage associated with a current-carrying circuit conductor proximate a superconductive shield is described by the relationship: $\phi_L = BA = \mu_0 \times H \times d_1 \times l$, where B is the magnetic field density adjacent the conductor, A represents the cross-sectional area adjacent the conductor through which the flux passes, $\mu_0$ is the magnetic permeability of the atmosphere surrounding the circuit conductor, $d_1$ is the distance separating the circuit conductor and shield plane, $l$ represents the length of the circuit conductor, and H is the magnetic field intensity between the conductor and plane. When the ground or shield plane is superconductive, the flux ($\phi_L$) linking the current in the circuit conductor is therefore restricted due to the proximity of the shield.

The field intensity (H) between the circuit conductor and ground plane is related to the conductor current (I) such that $$H = \frac{I}{W}$$

where W is the width of the circuit conductor or film. Therefore, the inductance (L) of the circuit conductor is defined as follows:

$$L=\frac{\phi_L}{I}=\frac{\mu_0\times H\times d_i\times l}{H\&W}=\frac{\mu_0\times d_i\times l}{W}$$

In the device described above, if the shield plane is removed or the shielding effect of the plane or a portion of the plane adjacent the conductor is destroyed, the flux linkage associated with the conductor is free to increase. With the shielding properties of part of the plane destroyed, thus creating a "hole" or "window" in the superconductive shield, the distance through which flux may be developed is no longer restricted by $d_i$ and the flux generated by the circuit film current can therefore increase to a value proportional to the size of the effective hole or aperture in the superconducting plane or to a saturation level, if so limited. The inductance of the circuit film increases proportionately. If the superconducting plane is fabricated with one or more physical holes or apertures therein, then destruction of the shielding properties of a relatively small portion of the plane adjacent or between said apertures will enable a relatively large increase in the inductance of the device to a value proportional to the effective hole or window thus created.

In the previously developed controlled inductance superconductor device a circuit conductor was positioned adjacent a soft superconductor area of a superconductive ground plane. A control conductor of approximately the same configuration as the circuit conductor was positioned substantially parallel to the circuit conductor and adjacent both the circuit conductor and the soft area of the plane. In this configuration of a superconducting controlled inductance device, transformer action due to electromagnetic coupling was found to occur between the control and circuit conductors which not only did not aid in the operation of the device but had the effect of limiting the rate of speed of response of the device. Also, due to the configuration and placement of the control conductor, a relatively large segment of the ground plane or shield had to be switched resistive which tended to cause the inductance control device to have a slow response.

Rapid response of inductance control devices is desirable for minimizing dissipation of power in the device during the period of transition between levels of inductance. Each time current is switched from one superconducting gate conductor path into another in a circuitry network, energy is transiently dissipated due to $I^2R$ losses in the gate conductor. Even though the relaxation time for electrons in superconducting materials is such that superconducting gates can be switched from a super-conducting state into a resistive state in pico-seconds ($10^{-12}$ seconds), redistribution of current may be orders of magnitude slower due to the inductance and resistance present in the circuit. The current is thus caused to continue flowing briefly through the resistive gate conductor with a consequent dissipation of energy therein in the form of $I^2R$ loss. Such energy losses cause local heating which can result in faulty operation, especially at high frequencies.

The configuration of the structure of the prior art device also limited the range of inductance control therein. A limited inductance variation and effect upon gate or circuit current was produced by the control current. A relatively large control current was therefore required for controlling significant magnitudes of circuit current. The amplification ratio between control current and circuit conductor current was therefore relatively small.

Accordingly, an object of this invention is to minimize inductive and magnetic field coupling between control and circuit conductors in superconductor inductance devices.

Another object of the present invention is to increase the amount of circuit current that may be controlled with a given control current in superconductive controlled inductance devices useful in various electrical computing apparatus.

A further object of the invention is to reduce energy dissipation in superconducting controlled inductance switching devices.

Other objects of the present invention are to increase the speed of operation and the efficiency of superconductive controlled inductance devices.

Still further objects of the present invention are to increase the efficiency and speed of response of controlled coupling superconductor transformers and to minimize electromagnetic coupling between the control and circuit conductors thereof.

In accordance with one embodiment of the present invention, a controlled inductance superconductor device includes a superconducting ground plane or shield having a plurality of apertures therein joined by bridge portions positioned at least partially adjacent a circuit conductor, the inductance of which is to be controlled. A narrow control conductor is positioned adjacent said bridge portions and substantially orthogonal to the circuit conductor for selectively controlling the inductance of said circuit conductor by affecting the conduction characteristics of the bridge portions.

In a second embodiment of the present invention a controlled coupling superconductor device includes a superconducting ground plane or shield having a plurality of apertures therein at least partially adjacent first and second circuit conductors. A control conductor substantially perpendicular to said circuit conductors is provided for affecting the conduction characteristics of portions of the superconductor plane joining the apertures and thereby controlling the inductive coupling between the conductors.

A feature of the present invention resides in the existence of apertures in the ground plane or shield of the controlled inductance superconductor device. Less material is required in constructing the shield and the shield is considerably lighter than that of prior art devices, especially when lead is used as the shield material.

Another feature of the present invention resulting from the presence of apertures in the ground plane or shield is greatly increased flexibility in the placement and configuration of the control conductor adjacent the circuit conductor and ground plane. The apertures permit the control conductor to cross less than the entire shield and also permit the control conductor to cross a portion of the shield in the manner of loops or windings for increasing the efficiency and speed of the device.

The exact nature, operation, and use of the subject controllable inductance superconductor device will be readily apparent from a consideration of the following detailed description thereof read in conjunction with the accompanying drawings in which:

FIG. 1 is a perspective view of the structure, partly broken away, of a preferred embodiment of the subject invention;

FIG. 1*a* is a perspective view of the subject invention illustrating a modification of part of the structure of FIG. 1;

Figure 1:
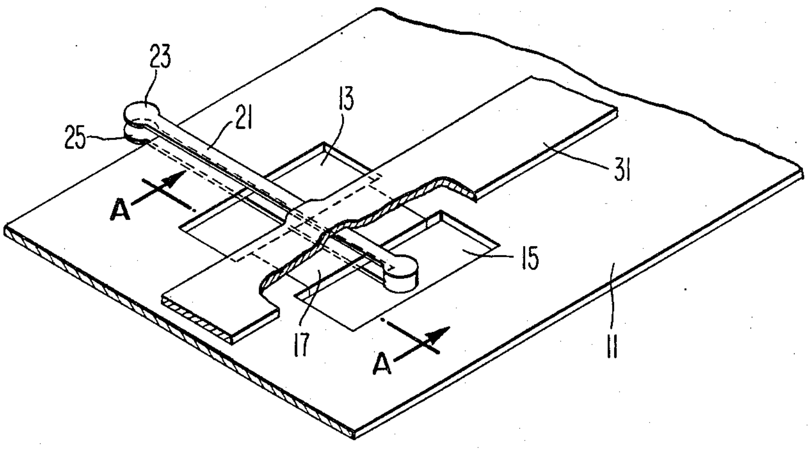

The drawing of FIG. 1 illustrates a device for controlling or switching the inductance magnitude of a circuit film or conductor 31. Current is caused to flow through circuit film 31 and means may be coupled thereto for monitoring changes in the inductance of the conductor, by detecting effects upon current flow through the element, for example.

The inductance of circuit film 31 is controlled by the presence of superconducting shield 11 spaced apart from and parallel to the film. Insulating material may be placed between the ground plane and the circuit film if desired, for establishing and maintaining electrical isolation therebetween. An opening in shield 11 is divided by bridge segment 17, thus creating apertures 13 and 15 in the plane. Circuit film 31 lies proximate this bridge portion as is shown. Any number of apertures and associated bridge portions may be provided in such a ground plane either for enabling incremental control of the inductance of a single circuit film or for enabling selective control of the inductance of a plurality of circuit conductors.

Shield 11 and bridge portion 17 are constructed of materials which become superconductive in the temperature environment contemplated for the device. As will be explained more fully below, the shield, or the bridge portion, or both may be fabricated from a "soft" superconductive material. Typically, and as shown in this embodiment, bridge portion 17 is a separate plaque of superconductive material which is soft in comparison to that of shield 11. Circuit film or conductor 31 may also be constructed of superconductive material, although not necessary for the operation of the invention. In the preferred embodiment, circuit film 31 and shield 11 both consist of a relatively hard superconductive material and bridge portion 17 is a relatively soft superconductor.

When cooled sufficiently, the ground plane, including bridge portion 17, becomes superconductive. Variation of current flow in circuit conductor 31 develops a magnetic field around the conductor, which being proximate shield 11, induces currents therein, the sum of which substantially equals the current of the circuit conductor due to the absence of resistance in the superconductive plane and the nearly complete linking of the plane by the flux field. The combination of currents thus induced in the ground plane develops a magnetic field which opposes the field associated with circuit conductor 31 and approximately equals it since the currents developing the fields are substantially equal.

The currents induced in the superconductive panel circulate around the periphery of apertures 13 and 15 in shield 11. The field therefrom, being equal and opposite to the field developed by the circuit film current, prevents net passage of magnetic lines of flux through the shield or the apertures. As previously noted, the effect of this opposing field is denoted the Meissner Effect in the superconductor art. The magnetic flux surrounding circuit film 31 and produced by current flowing therethrough is thereby restricted to that portion of the device above the superconducting ground plane defined by the superconductive shield and the bridge segment.

Figure 2:
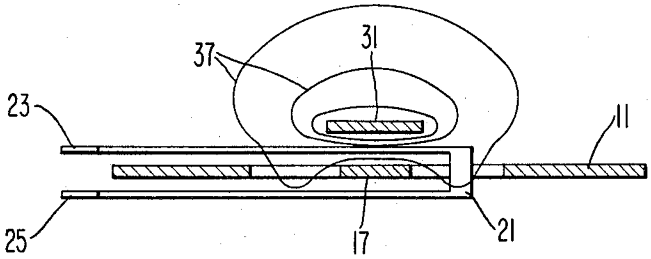
FIG. 2 is a functional drawing of the apparatus of FIG. 1 taken along a cross section designated A—A therein with no control current applied.

The magnetic flux field developed in the superconductor inductance device with the ground plane superconducting is illustrated in FIG. 2, a cross-sectional view taken along the line inscribed A—A in FIG. 1. As shown, the lines of magnetic flux 37 generated by current flow in circuit film 31 surround the circuit film and are adjacent the superconducting shield 11 but do not pass through the shield. Although lines of magnetic flux may pass into apertures 13 and 15 as shown in FIG. 2, there is no net passage of flux through the apertures or any other portion of the superconducting shield 11 as a result of the Meissner Effect. Reference may be made to an article entitled "Coincident-Current Superconductive Memory" by Burns, Alphonse, and Leck, appearing at p. 438 of the September 1961 issue of the IRE Transactions on Electronic Computers for an additional illustration of the magnetic flux pattern developed by a conductor in proximity to an apertured superconductor plane.

Under these conditions the inductance of circuit film 31, is limited to a specific value, being restricted in part by the area through which the flux linkages may pass between the film and the ground plane. This area is defined by the length of circuit film 31 and the distance between the circuit film and superconducting shield 11.

In order to increase the inductance of circuit film 31, the shielding properties of at least part of the superconducting plane adjacent the conductor must be destroyed or the shield must be removed. Referring again to FIG. 1, a control conductor 21, having terminals 23 and 25, is positioned in proximity to bridge portion 17 of the superconducting plane and substantially orthogonal thereto for affecting the conduction characteristics of the bridge portion. By causing a sufficient current flow in control conductor 21, a total field may be developed thereby which is sufficient to exceed the critical field of superconducting bridge segment 17 and thus quench its superconductivity. It should be noted that the total magnetic field applied to the ground plane or shield consists of the sum of the fields developed by current flow in the control conductor and in the circuit conductor. It is not essential that the field developed by the control conductor be sufficient in itself for rendering bridge portion 17 resistive, so long as the sum of the fields applied by the conductors equals or exceeds the critical magnetic field of the soft superconductor bridge portion.

When bridge portion 17 joining apertures 13 and 15 becomes normally conductive, the current induced in the bridge portion is reduced. The route of the currents induced in the superconducting shield is changed from a path surrounding the apertures individually to one surrounding the apertures and bridge portion 17 collectively. When this occurs, lines of magnetic flux may penetrate the apertures and the bridge portion and the flux generated by current flow in circuit film 31 therefore increases. The self-inductance of circuit film 31 increases proportionally with the increase in the magnetic flux associated therewith.

So long as either shield 11 or bridge portion 17 is a soft superconductor, actuation of control conductor 21 with sufficient current will cause a change in the inductance of circuit film 31. If bridge portion 17 is a soft superconductor and shield 11 is a hard superconductor, then the induced currents will be shifted from the bridge portion 17 to a path surrounding the apertures and bridge portion and exclusively within the shield upon actuation of control conductor 21, as discussed above. If both shield 11 and the bridge portion 17 are soft superconductors, then, upon the application of a control field of magnitude sufficient for causing the soft superconductive material to become resistive, the current induced in the entire ground plane will decrease and the flux field and inductance of the circuit conductor will increase.

If shield 11 is a soft superconductor and bridge portion 17 is a hard superconductor, then actuation of the control conductor will enable only a small increase in the lines of flux developed by current flow in circuit conductor 31 when situated as shown in FIG. 1 and therefore only a small change in the inductance of the conductor. For achieving a greater change in the inductance of the circuit conductor when shield 11 is soft and bridge portion 17 is hard, the circuit conductor must be proximate the controlled portion of the shield. If the control conductor extends across the entire plane, then actuation of the control conductor will abruptly decrease the current induced in the plane and cause a change in the inductance of the circuit conductor of film.

When it is desired that bridge portion 17 have a lower critical field than the remainder of the plane, the bridge portion may be fabricated from a soft superconductive material or may be constructed with a restricted cross section in comparison to the remainder of the plane. The low critical field characteristic of restricted cross-section superconductors is taught in A. R. Suss Patent No. 3,078,445, entitled "Information Storage."

It may be considered desirable to fabricate both the control conductor and the circuit film from a superconductive material which remains superconducting in the presence of the magnetic field that causes a portion of the superconductive ground plane to become resistive. Under this condition, when the magnetic field is applied, the circuit film or conductor 31 is not switched to its resistive state although its inductance is increased, and therefore the conductor continues to operate in its superconductive state. The materials used for fabricating the control and circuit conductors would have a higher critical magnetic field than the controlled portion of the ground plane for achieving this desideratum.

Figure 3:
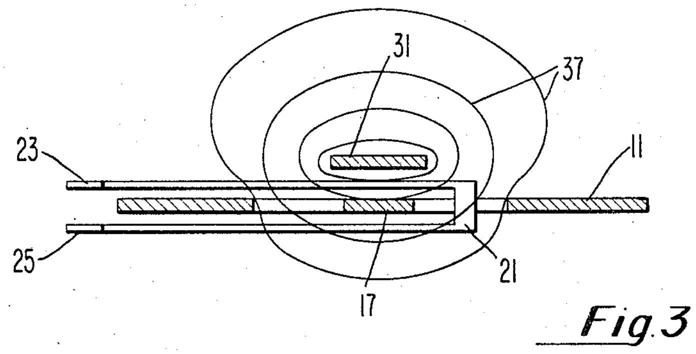
FIG. 3 is a second functional drawing of the apparatus of FIG. 1 taken in cross section along the line inscribed A—A in FIG. 1 with the control conductor activated.

The flux pattern established by current flow in circuit film 31 when the superconductivity of bridge portion 17 is quenched, is shown in FIG. 3. The lines of flux 37 which surround circuit film 31 now pass through apertures 13 and 15 and bridge segment 17. As a result of the actuation of control conductor 21, the area through which magnetic flux from circuit conductor 31 may pass is no longer limited by the distance separating the conductor from the ground plane. The distance between the conductor and the newly formed current path within the ground plane becomes the new limit upon the flux area. The magnitude of the initial inductance value and the amount of change in the inductance of the circuit conductor is therefore dependent upon structural dimensions.

A structure of the type illustrated in FIG. 1 has been operated wherein circuit film 31 and superconducting shield 11 were composed of lead and bridge segment 17 of tin, which is a "softer" superconductor material than lead. Tests of this device were conducted which indicated that an inductance increase of the order of 100 is realizable with this configuration. A switching time constant of approximately 3.8 micro-seconds was observed with the device of FIG. 1 operated as an inductance switch, in comparison to a time constant of approximately 5.2 micro-seconds for a cryotron current switch of similar size and constructed of similar materials. This lower time constant indicates achievement of the desired increase of speed of operation, thus enabling the switch of the present invention to be operated at higher frequencies than that of cryotron current switches.

It should be noted that bridge segment 17 may be driven into its normal conducting state for achieving the objects of this invention by subjecting it to electric as well as magnetic fields or by heating the segment with an element orthogonal to the circuit conductor. For achieving the desired inductance control of the subject invention, all that is required is that the bridge or other portion of the ground plane adjacent the circuit conductor be driven resistive by exceeding its critical field, current or temperature.

A complete current switching system having parallel current conductors or tree circuits as shown, for example, in the above-noted Patent No. 3,275,930, may be constructed utilizing a device of the type shown in FIG. 1. Inductance switches mounted on separate plaques may be utilized in such a system or one superconducting shield or ground plane with a multiplicity of pairs of apertures and bridge segments therebetween may be utilized to accomplish the desired current switching and inductance control of one or several circuit conductors.

Although control conductor 21 is shown substantially orthogonal to both bridge segment 17 and circuit film 31 in the preferred embodiment, it should be noted that this orthogonal relationship is not essential to the operation of the invention. The effect of varying the angle subtended by the circuit film and the control conductor is to change the amount of inductive coupling between those two conductors, the minimum occurring when the conductors are at right angles.

Use of a control conductor of narrower width than the circuit conductor film in the present invention makes current gain possible. The amount of circuit current which is controlled by current flow in the control conductor of the present invention depends upon the relative widths of the two conductors.

Figure 1A:
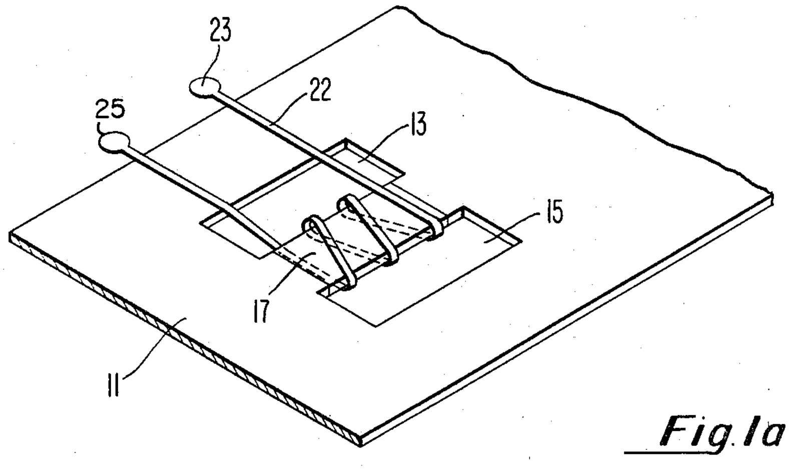

FIG. 1*a* is a view of the invention showing a modification of part of the structure shown in FIG. 1. A modified control conductor 22 is shown connected between control conductor terminals 23 and 25 and passed across and around bridge portion 17 in a plurality of loops. FIG. 1*a* also shows that terminals 23 and 25 may both lie on the same side of the shield. It should be noted that the control conductor need not loop or lie across both surfaces of the portion of the plane to be rendered resistive. The control conductor could lie across only one surface of the bridge, for example, in a single or multiple pass, with the entire control conductor as well as its terminals lying on one side of the plane.

Figure 4:
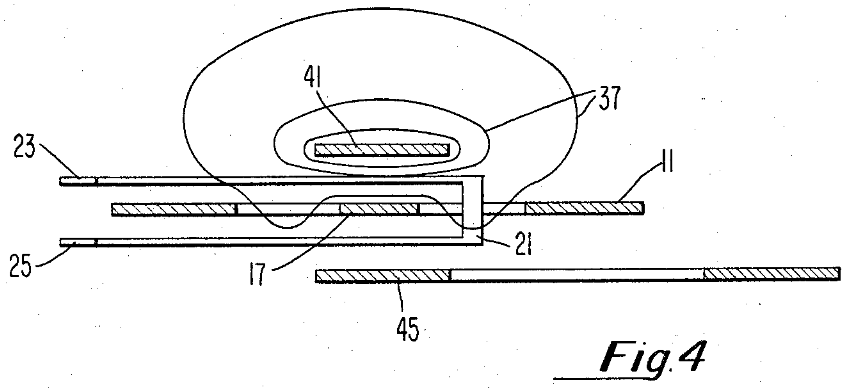
FIG. 4 is a functional side section of a second embodiment of the present invention with no coupling between circuit conductors.
Figure 5:
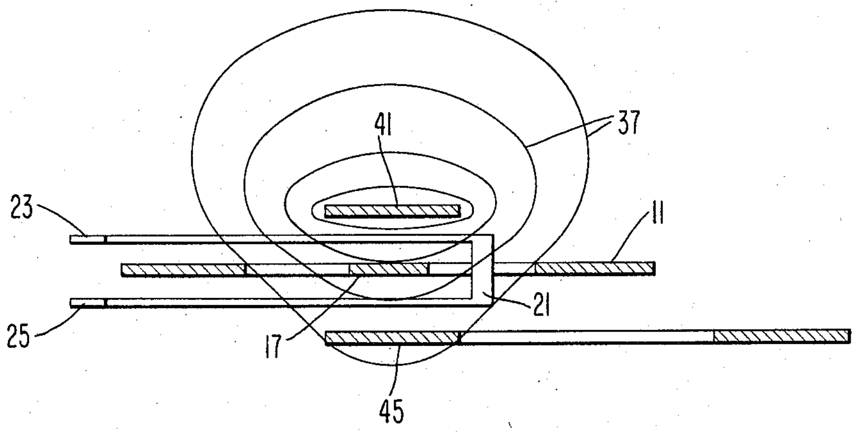
FIG. 5 is a functional side section of the second embodiment of the invention showing inductive coupling between primary and secondary circuit conductors.

As illustrated in FIGS. 4 and 5, the selective control of the mutual inductance or inductive coupling between two spaced circuit elements, as well as the control of the self-inductance of a single circuit conductor, may be improved by employing the features of the present invention.

Referring to FIG. 4, a controlled coupling superconductor transformer is illustrated wherein magnetic coupling between a primary circuit film 41 and a secondary circuit film 45 is controlled. When the entire plane is superconducting and no energization is applied to control conductor 21, the magnetic flux surrounding primary circuit film 41 is constrained between bridge segment 17 and the primary circuit film. With the flux lines 37 so restricted, none of them links secondary circuit film 45 and hence there is no magnetic coupling between the two films and consequently no mutual or inductive coupling therebetween.

Upon energization of conductor 21, bridge segment 17 is caused to become normally conducting, thus enabling magnetic flux line penetration through the apertures and bridge segment 17. As shown in FIG. 5, magnetic flux lines 37 then begin to link secondary circuit film 45 and inductive coupling between the primary and secondary circuit films is thereby achieved. Variation of current flow in primary circuit film 41 will then induce a variation of current flow in secondary circuit film 45 by virtue of the coupling therebetween. The controlled coupling device is rendered more efficient and the coupling more rapid than prior art devices by the use of an orthogonally placed control conductor of narrow width.

The controlled coupling transformer illustrated in FIGS. 4 and 5 may be advantageously employed in superconductive logic circuits or in other superconductor devices in which selectively controlled signal coupling is desired, such as input and output couplings or for transformer impedance matching, for example.

It should be noted that although the control conductor shown in FIGS. 1 through 5 is a loop partially encircling the bridge segment and superconducting shield, the control conductor for devices constructed in accordance with the subject invention may as well be a planar strip or film positioned adjacent the ground plane and preferably substantially orthogonal to the circuit conductor.

Superconducting devices employing superconducting elements have been described in which the inductance of a circuit conductor may be controlled by control of the shielding qualities of portions of a superconducting ground plane or shield which lie between apertures in the plane. By causing a portion of the ground plane adjacent the apertures to become normally conducting or resistive, the magnetic field around a current-carrying conductor, which may itself be superconducting, is increased in magnitude and the inductance of the conductor increases proportionately. High speed current switching is achieved and efficiency of current switching is increased by reducing the amount of energy loss associated with heat dissipation common to cryotronic switches. An improved controlled coupling transformer which utilizes the subject field and inductance controlling technique has also been described.

What is claimed:

1. In a cryogenic apparatus in which current flow in a circuit conductor may be restrained by energizing a control conductor, a controlled inductance superconductor device including:

an apertured superconductive ground plane having adjacent an aperture a portion which is characterized by a low critical magnetic field;

said low critical magnetic field portion lying in field-responsive relationship with said control conductor and in inductance-limiting relationship with said circuit conductor, said circuit conductor characterized by a high critical magnetic field and remaining continuously superconductive; and said control conductor lying substantially orthogonal to said circuit conductor for diminished transformer coupling between said control conductor and said circuit conductor.

2. The invention recited in claim 1 in which the control conductor is narrower than the circuit conductor and is sandwiched between the circuit conductor and the ground plane.

3. In a superconducting controlled inductance device in which selective control of the magnetic shielding properties of a superconductive plane is utilized for incrementally varying the inductance of a continuously superconductive circuit conductor being characterized by a high critical magnetic field inductively associated therewith, the improvement comprising:

a superconductive shield plane having therein a plurality of apertures, the segment separating adjacent apertures being characterized by a critical magnetic field different from that of the remaining plane area, the circuit conductor inductively associated with said shield plane lying adjacent the segment which separates apertures therein, and control means for causing at least a portion of the shield plane segment lying adjacent said circuit conductor and between apertures to become resistive thereby increasing the inductance of said circuit conductor;

said control means being positioned for minimal electromagnetic coupling with said circuit conductor.

4. The controlled inductance device of claim 3 in which the control means includes magnetic field means having a superconducting conductor which is narrower than said circuit conductor and positioned at substantially right angles to said circuit conductor.

5. A superconductor device, comprising:

a continuously superconductive circuit conductor whose self-inductance is to be controlled;

an apertured ground plane of a first superconductive material;

a plaque of a second superconductive material positioned for electrically bridging an aperture in said ground plane and thereby forming at least one closed superconductive current path which limits the inductance of the circuit conductor by preventing its magnetic flux field from penetrating said plane, and control means for causing at least a portion of said current path to become resistive thereby increasing the inductance of said circuit conductor, said control means being positioned for minimum magnetic coupling with said circuit conductor.

6. The invention of claim 5 in which the control means includes a superconductive control conductor which is narrower than the circuit conductor and is at least partially looped around the superconductive plaque for applying thereto a magnetic flux field for destroying its superconductivity.

7. A controllable superconductor switch, comprising:

a superconductive shield element having at least one cut-out portion, a superconductive bridge element electrically continuous with at least two edges of said shield element at said cut-out portion thereby forming a closed superconductive current path, a continuously superconducting circuit conductor adjacent said bridge element and positioned for inductive coupling with said superconductive current path, said superconductive shield element and said circuit conductor being characterized by a critical magnetic field which is greater than that of the superconductive bridge element, and control means including magnetic field means positioned approximately perpendicular to the circuit conductor for selectively switching a portion of at least one of said superconductive elements into a normally conductive state by applying thereto an electromagnetic field which exceeds its critical magnetic field for thereby causing the inductance of said circuit conductor to increase, said control means being positioned for minimal inductive coupling with said circuit conductor.

8. The invention of claim 7, in which the control means is comprised of a pair of conducting strips lying adjacent opposite surfaces of the bridge and electrically joined within the bridged cut-out portion of the shield, each conducting strip being narrower than the circuit conductor.

9. In a variable coupling superconductor transformer in which coupling between a primary and a secondary circuit conductor is selectively enabled, the improvement comprising:

a shield fabricated from a first superconductive material having at least one cut-out portion and positioned between the circuit conductors, a bridge element fabricated from a second superconductive material and positioned for electrically bridging a cut-out portion of said shield and thereby forming a closed super-conductive current path for preventing inductive coupling between said primary and secondary circuit conductors, and control means for causing at least a portion of one of said superconductive materials to become normally conductive, said control means oriented for minimal magnetic coupling with said circuit conductors.

10. The superconductor transformer of claim 9 wherein the bridge element is characterized by a lower critical magnetic field than that of the shield, and the control means includes magnetic field means.

11. The device of claim 10 in which the control means includes a superconductive conductor which is narrower than the primary circuit conductor, and the control conductor lies across at least two surfaces of the bridge element and substantially at right angles to said primary circuit conductor.

12. The device of claim 11 in which the primary and secondary circuit conductors are conductive films and the circuit conductors and the shield are spaced apart and substantially parallel to each other.

13. The device of claim 12 wherein the control conductor is at least partially looped around said bridge element.

14. A superconductive device, comprising:

means for controlling the self-inductance of a continuously superconducting circuit conductor of high critical magnetic field, including:

an energizable control conductor, an apertured superconductive ground plane having adjacent to an aperture an area which is characterized by a low critical magnetic field;

said low critical magnetic field portion lying in field responsive relationship with said control conductor and inductance limiting relationship with said circuit conductor; and said control conductor lying substantially orthogonal to said circuit conductor for diminished transformer coupling between said control conductor and said circuit conductor.

15. A superconductor device for controlling the inductance of a circuit conductor, comprising:

an apertured ground plane of a first superconductive material;

a plaque of a second superconductive material positioned for electrically bridging an aperture in said ground plane and thereby forming at least one closed superconductive current path which limits the inductance of the circuit conductor by preventing its magnetic flux field from penetrating said plane;

a superconductive control conductor which is narrower than the circuit conductor and is at least partially looped around the superconductive plaque for applying thereto a magnetic flux field for destroying its superconductivity and thereby increasing the inductance of said circuit conductor;

said control means being positioned for minimum magnetic coupling with said circuit conductor.

16. A controllable superconductor inductance switch, comprising:

a superconductive shield element having at least one cut-out portion, a superconductive bridge element electrically contiguous with at least two edges of said shield element at said cut-out portion thereby forming a closed superconductive current path, said bridge element being characterized by a critical magnetic field which is lower than that of said superconductive shield element, a circuit conductor adjacent to said bridge element and positioned for inductive coupling with said superconductive current path; and control means for selectively switching a portion of at least one of said superconductive elements into a normally conductive state by applying thereto an electromagnetic field which exceeds its critical magnetic field for thereby causing the inductance of said circuit conductor to increase;

said control means comprising a pair of conducting strips lying adjacent to opposite surfaces of the bridge and electrically joined within the bridged cut-out portion of the shield and positioned approximately perpendicular to said circuit conductor, each control conducting strip being narrower than the circuit conductor.

References Cited

UNITED STATES PATENTS

| | | | |
|---|---|---|---|
| 2,914,735 | 11/1959 | Young | 340—173.1 |
| 3,086,130 | 4/1963 | Meyers et al. | 323—44 |
| 3,094,685 | 6/1963 | Crowe | 340—173.1 |
| 3,196,282 | 7/1965 | Ittner | 307—88.5 |
| 3,263,220 | 7/1966 | Crowe | 340—173.1 |
| 3,271,585 | 9/1966 | Crowe | 340—173.1 X |

FOREIGN PATENTS

| | | |
|---|---|---|
| 240,238 | 1/1961 | Australia. |

JOHN F. COUCH, *Primary Examiner.*

WARREN E. RAY, *Examiner.*

A. D. PELLINEN, *Assistant Examiner.*

UNITED STATES PATENT OFFICE
CERTIFICATE OF CORRECTION

Patent No. 3,384,809 May 21, 1968

Albert J. Meyerhoff et al.

It is certified that error appears in the above identified patent and that said Letters Patent are hereby corrected as shown below:

Column 1, lines 48 and 49, "superconducting" should read -- superconductive --. Column 5, line 41, "panel" should read -- plane --. Column 10, line 60, claim reference numeral "12" should read -- 11 --.

Signed and sealed this 17th day of February 1970.

(SEAL)
Attest:

Edward M. Fletcher, Jr.
Attesting Officer

WILLIAM E. SCHUYLER, JR.
Commissioner of Patents